(12) United States Patent
Muramatsu et al.

(10) Patent No.: US 6,703,598 B2
(45) Date of Patent: Mar. 9, 2004

(54) SEMICONDUCTOR PHOTO-DETECTING APPARATUS

(75) Inventors: Masaharu Muramatsu, Hamamatsu (JP); Katsumi Shibayama, Hamamatsu (JP); Tomohisa Itoh, Hamamatsu (JP)

(73) Assignee: Hamamatsu Photonics K.K., Shizuoka (JP)

( * ) Notice: Subject to any disclaimer, the term of this patent is extended or adjusted under 35 U.S.C. 154(b) by 53 days.

(21) Appl. No.: 10/266,690

(22) Filed: Oct. 9, 2002

(65) Prior Publication Data

US 2003/0034436 A1 Feb. 20, 2003

Related U.S. Application Data

(63) Continuation-in-part of application No. PCT/JP01/03076, filed on Apr. 10, 2001.

(30) Foreign Application Priority Data

Apr. 11, 2000 (JP) ..................................... P2000-109763

(51) Int. Cl.$^7$ .......................... H01L 31/00; H01L 29/26; H01L 29/267; H01L 31/0203; H01J 40/14
(52) U.S. Cl. ..................... 250/214.1; 250/216; 250/239; 257/80; 257/81; 257/433; 257/434
(58) Field of Search .............................. 250/214.1, 216, 250/239; 257/80, 81, 82, 83, 84, 433, 434, 435

(56) References Cited

U.S. PATENT DOCUMENTS 5,600,130 A * 2/1997 Van Zeghbroeck

FOREIGN PATENT DOCUMENTS

| JP | 63-102344 | * | 5/1988 |
| JP | 03-257951 | * | 11/1991 |
| JP | 3-257951 | | 11/1991 |
| JP | 6-45574 | | 2/1994 |
| JP | 9-121000 | | 5/1997 |
| JP | 09-121000 | * | 5/1997 |

* cited by examiner

Primary Examiner—David Porta
Assistant Examiner—David C Meyer
(74) Attorney, Agent, or Firm—Morgan, Lewis & Bockius LLP

(57) ABSTRACT

A semiconductor photodetecting apparatus 1 comprises a base 2 and a CCD chip 4. The CCD chip 4 is secured to the base 2 when a resin 8 is supplied and cured. The base 2 is formed with a gas supply path 15 and a gas exhaust path 16. Each of the gas supply path 15 and gas exhaust path 16 has one end opening to the upper face 2d of the base 2, and the other end opening to an end face of a mounting portion 2a. A gas storage section 19 and a gas supply pump 20 are connected to the gas supply path 15, whereby the gas supply pump 20 supplies $N_2$ gas stored in the gas storage section 19 to a space within the base 2 by way of the gas supply path 15. The $N_2$ gas supplied to the space is discharged from the gas exhaust path 16 after being refluxed through the space.

4 Claims, 5 Drawing Sheets

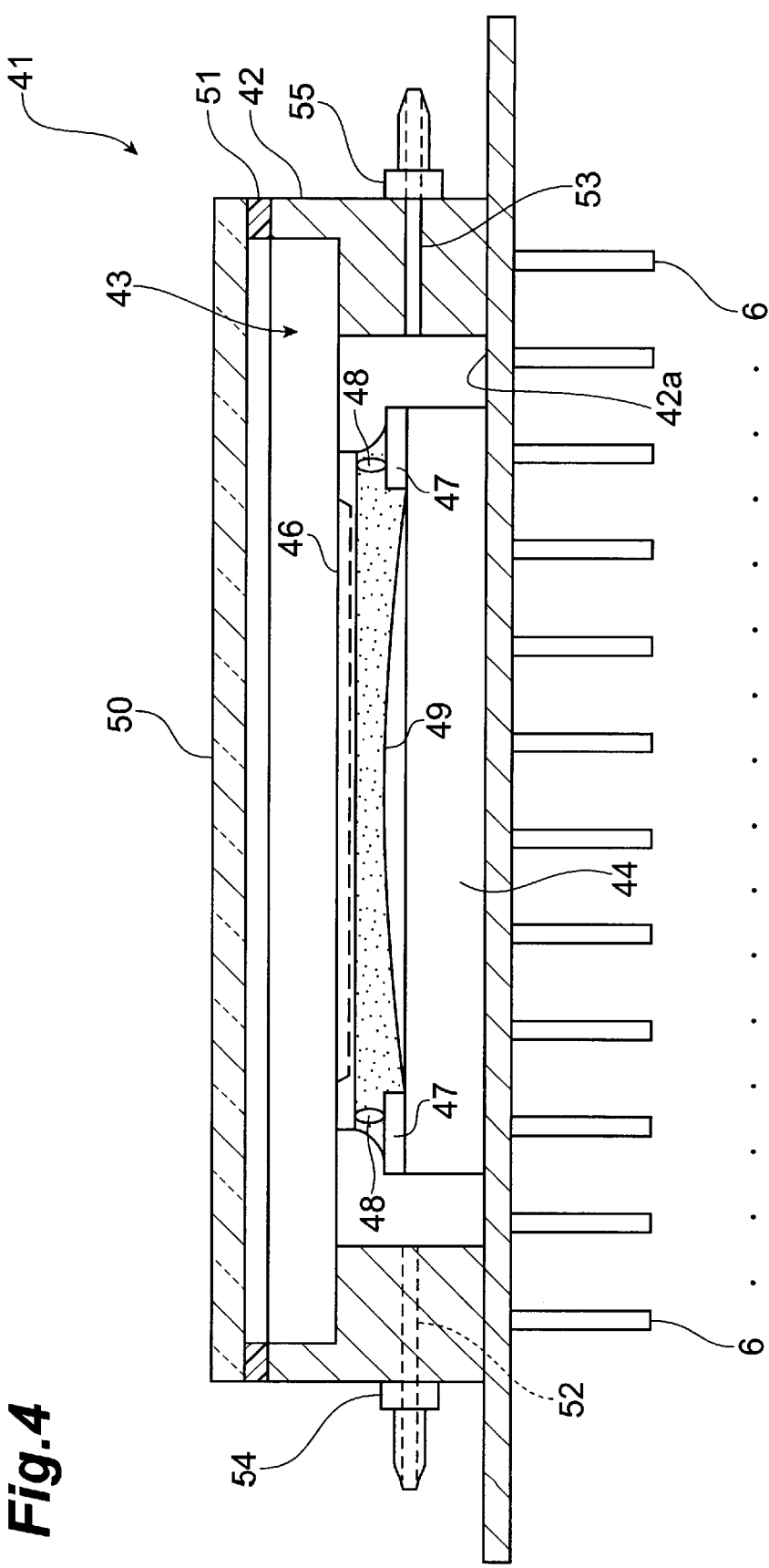

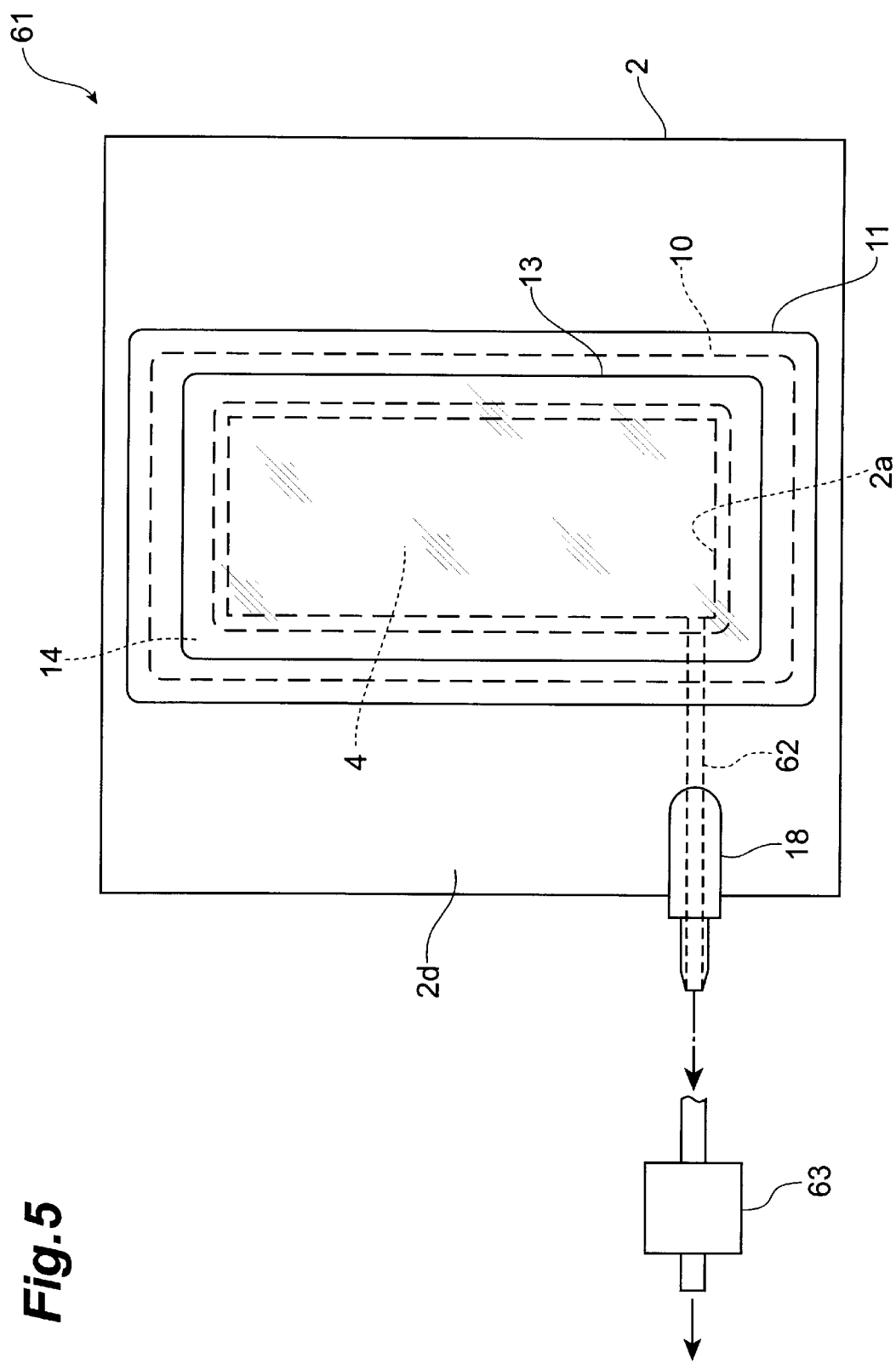

SEMICONDUCTOR PHOTO-DETECTING APPARATUS

RELATED APPLICATION

This is a continuation-in-part application of application serial no. PCT/JP01/03076 filed on Apr. 10, 2001, now pending.

BACKGROUND OF THE INVENTION

1. Field of the Invention

The present invention relates to a semiconductor photo-detecting apparatus comprising a semiconductor photodetecting device arranged within a container having a transparent window.

2. Related Background Art

In this kind of semiconductor photodetecting apparatus, several resins have been used in various parts. For example, the semiconductor photodetecting apparatus disclosed in Japanese Patent Application Laid-Open No. HEI 6-45574 comprises a container (package) having a transparent window (window member) and a semiconductor photodetecting device (a CCD chip including an n-type epi layer, CCD, and the like); disposed within the container, for detecting the light incident thereon from the transparent window, whereas the space between the CCD chip and a silicon wafer to which the CCD chip is bump-bonded is filled with a resin.

Also, epoxy adhesives have been used for securing the transparent window to the container, and for securing the semiconductor photodetecting device to the container, and the like.

SUMMARY OF THE INVENTION

As a result of investigations and studies, the inventors have newly found the following fact.

If the light detected by the semiconductor photodetecting device in a semiconductor photodetecting apparatus using a resin includes ultraviolet rays, for example, the resin will be decomposed and the components will be released in the container. The released component of resin will adsorb to the inside of the transparent window or the surface of semiconductor photodetecting device (photodetecting surface). Thus, it has been found that the decomposed components released from the resin may adsorb to the inside of the transparent window or the surface of semiconductor photodetecting device (photodetecting surface) and coagulate thereon, thereby lowering the transmissivity of measurement light (incident light) and deteriorating the photodetecting sensitivity of the semiconductor photodetecting device.

In view of the point mentioned above, it is an object of the present invention to provide a semiconductor photodetecting apparatus by which decomposed components released from several resins can be let out of the container, so as to restrain the semiconductor photodetecting device from lowering its photodetecting sensitivity.

For achieving the above-mentioned object, the semiconductor photodetecting apparatus of the present invention comprises a container having a transparent window; and a semiconductor photodetecting device, disposed within the container, for detecting light incident thereon from the transparent window, the apparatus using a resin; the apparatus further comprising gas flowing means for flowing a gas within the container so as to let out of the container decomposed components released from the resin in the container.

Since gas flowing means for flowing a gas within the container so as to let out of the container decomposed components released from the resin in the container is provided, even when the resin is decomposed and is released as decomposed components in the container, the decomposed components released from the resin is let out of the container. Therefore, the decomposed components released from the resin are restrained from adsorbing to the inside of the transparent window or the surface of semiconductor photodetecting device (photodetecting surface) and coagulating thereon, whereby the transmissivity of measurement light (incident light) is kept from deteriorating. As a result, the semiconductor photodetecting device can be restrained from lowering its photodetecting sensitivity.

In the semiconductor photodetecting apparatus of the present invention, the gas flowing means may have gas exhaust means for letting out the decomposed components from the inside of the container.

When the above-mentioned gas exhaust means is provided, the decomposed components released from the resin in the container can reliably be let out of the container.

In the semiconductor photodetecting apparatus of the present invention, the gas flowing means may further comprise gas supply means for supplying a predetermined gas into the container.

When the above-mentioned gas supply means is further provided, the predetermined gas supplied from the gas supply means is refluxed within the container, whereby the decomposed components released from the resin in the container can be let out of the container.

The semiconductor photodetecting apparatus of the present invention may be characterized in that the gas exhaust means includes a gas exhaust path formed in the container, the gas supply means includes a gas supply path formed in the container, and the gas exhaust path and gas supply path open at respective positions diagonal to each other in the container.

In this case, the predetermined gas is refluxed over the whole part in which the semiconductor photodetecting device is disposed within the container, whereby the decomposed components released from the resin in the container can efficiently be let out of the container.

The present invention will become more fully understood from the detailed description given hereinbelow and the accompanying drawings which are given by way of illustration only, and thus are not to be considered as limiting the present invention.

Further scope of applicability of the present invention will be come apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 4 is a sectional view of the semiconductor photodetecting apparatus in accordance with the second embodiment; and FIG. 5 is a plan view of the semiconductor photodetecting apparatus in accordance with a third embodiment.

DESCRIPTION OF THE PREFERRED EMBODIMENTS

Figure 1:
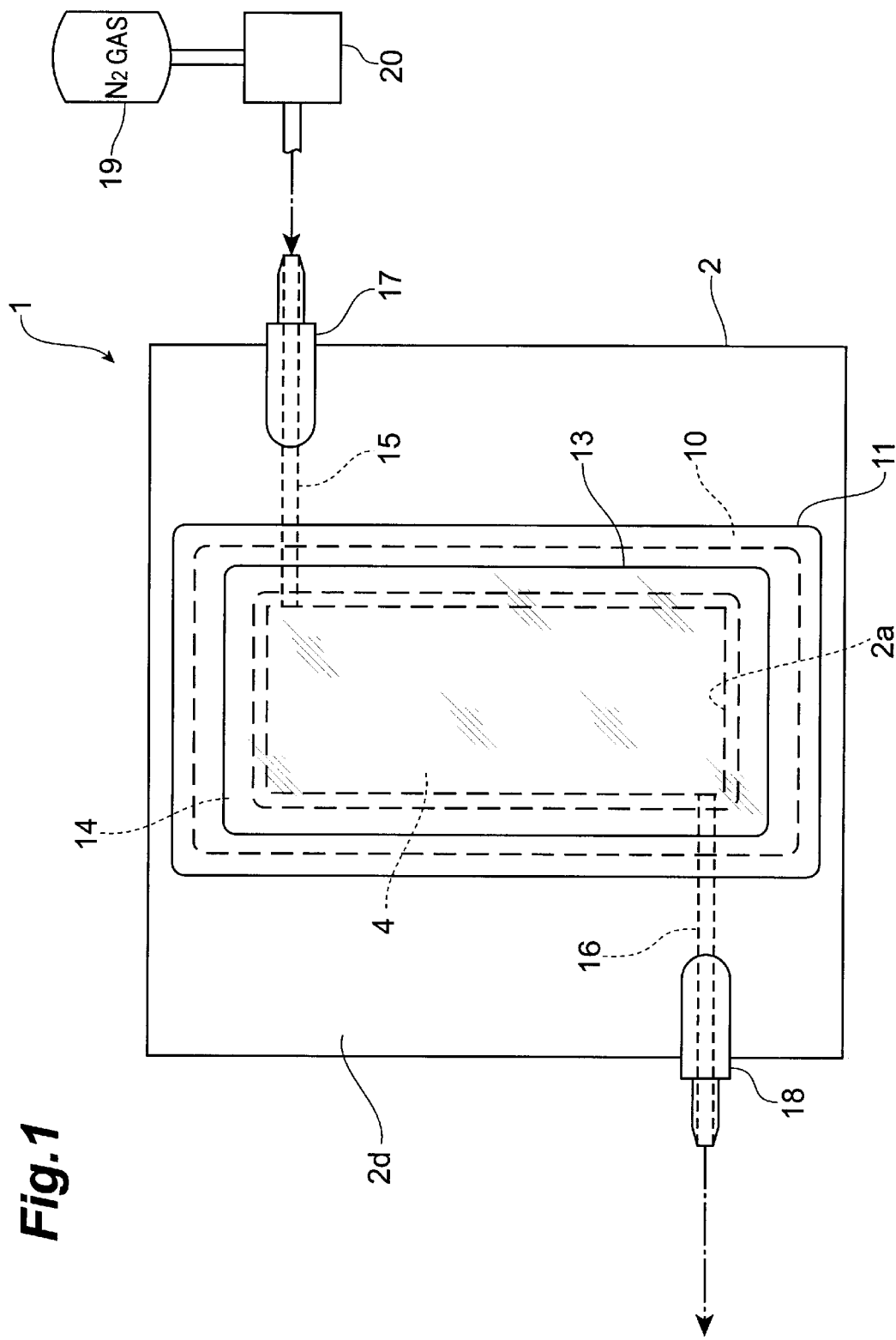
FIG. 1 is a plan view of the semiconductor photodetecting apparatus in accordance with a first embodiment.

The semiconductor photodetecting apparatus in accordance with embodiments of the present invention will be explained with reference to the drawings. Among the drawings, constituents identical to each other or having functions identical to each other will be referred to with numerals identical to each other without repeating their overlapping explanations.

First to third embodiments show examples in which the present invention is applied to a semiconductor photodetecting apparatus comprising a backside illumination type CCD (Charge Coupled Device) chip in which the photodetecting portion of the substrate is thinned so that light is made incident thereon from the backside of the surface formed with an electrode for reading out electric charges.

First Embodiment

First, with reference to FIGS. 1 and 2, the semiconductor photodetecting apparatus 1 in accordance with the first embodiment will be explained.

The semiconductor photodetecting apparatus 1 has a base 2 made of ceramics, whereas a hollow portion 3 is formed at the center part of the base 2. In the first embodiment, a backside illumination type CCD chip 4, acting as a semiconductor photodetecting device, is mounted in a mounting portion 2a by way of a spacer 5 such that the backside becomes a light incident surface, and is fixed with respect to the mounting portion 2a (base 2). The spacer 5 has elasticity, thereby restraining the CCD chip 4 from generating warpage and the like. A step 2b formed with a predetermined height from the mounting portion 2a is provided with bonding pads (not depicted) for connecting electrodes of the CCD chip 4 to the outside. The bonding pads are conducted electrically to the leads 6 of the outside of the base 2 through a metal layer formed in an intermediate portion of the base 2. The electrodes of the CCD chip 4 and their corresponding bonding pads are connected to each other by means of bonding wires 7.

When a resin 8 cures, the thinned CCD chip 4 is reinforced and protected thereby and is secured to the base 2, while being sealed with a cover member 9 on a surface 2c opposite to the light incident surface.

A seal ring 10 acting as a seal frame is firmly attached to the upper face (surface on the light incident surface side) of the base 2 by brazing or the like in a state surrounding the hollow portion 3. The seal ring 10 is sealed with a cap 11 in a seam welding fashion. As mentioned above, the cap 11 is welded in a state where its outer peripheral part is mounted thereon, and has an opening 12 formed at a position opposing the photodetecting surface of the CCD chip 4. The cap 11 is formed from covar (Fernico), whereas its surface is plated with gold.

A window portion 13 acting as a transparent window is firmly attached to the cap 11 so as to cover the opening 12. The window portion 13 is made of a planar silica (quartz) glass material, while its upper and under surfaces are polished so as to transmit ultraviolet rays therethrough. Also, the end part of the light incident surface in the window portion 13 is firmly attached to the upper face of the cap 11 (the surface opposite from the surface facing the CCD chip 4) over the whole periphery by way of an adhesive layer 14, whereby the window portion 13 is securely fixed to the cap 11. The adhesive layer 14 uses an epoxy adhesive. It is desirable that a light-shielding metal film or the like be formed on the surface of silica glass (window portion 13) in the part provided with the adhesive layer 14, so as to prevent ultraviolet rays from irradiating the adhesive layer 14.

The base 2 is formed with a gas supply path 15 and a gas exhaust path 16. The gas supply path 15 has one end opening to the upper face (the surface on the light incident surface side) 2d of the base 2, and the other end opening to an end face of the mounting portion 2a. A pipe 17 is connected to the gas supply path 15 on its one end side. The pipe 17 is configured detachable, and is attached to the opening part of the base 2 on the one end side of the gas supply path 15 after the base 2 is hermetically sealed while the CCD chip 4 is secured thereto.

As with the gas supply path 15, the gas exhaust path 16 is provided so as to have one end opening to the upper face (the surface on the light incident surface side) 2d of the base 2 and the other end opening to an end face of the mounting portion 2a. A pipe 18 is connected to the gas exhaust path 16 on its one end side. The pipe 18 is configured detachable, and is attached to the opening part of the base 2 on the one end side of the gas exhaust path 16 after the base 2 is hermetically sealed as with the pipe 17.

Figure 2:
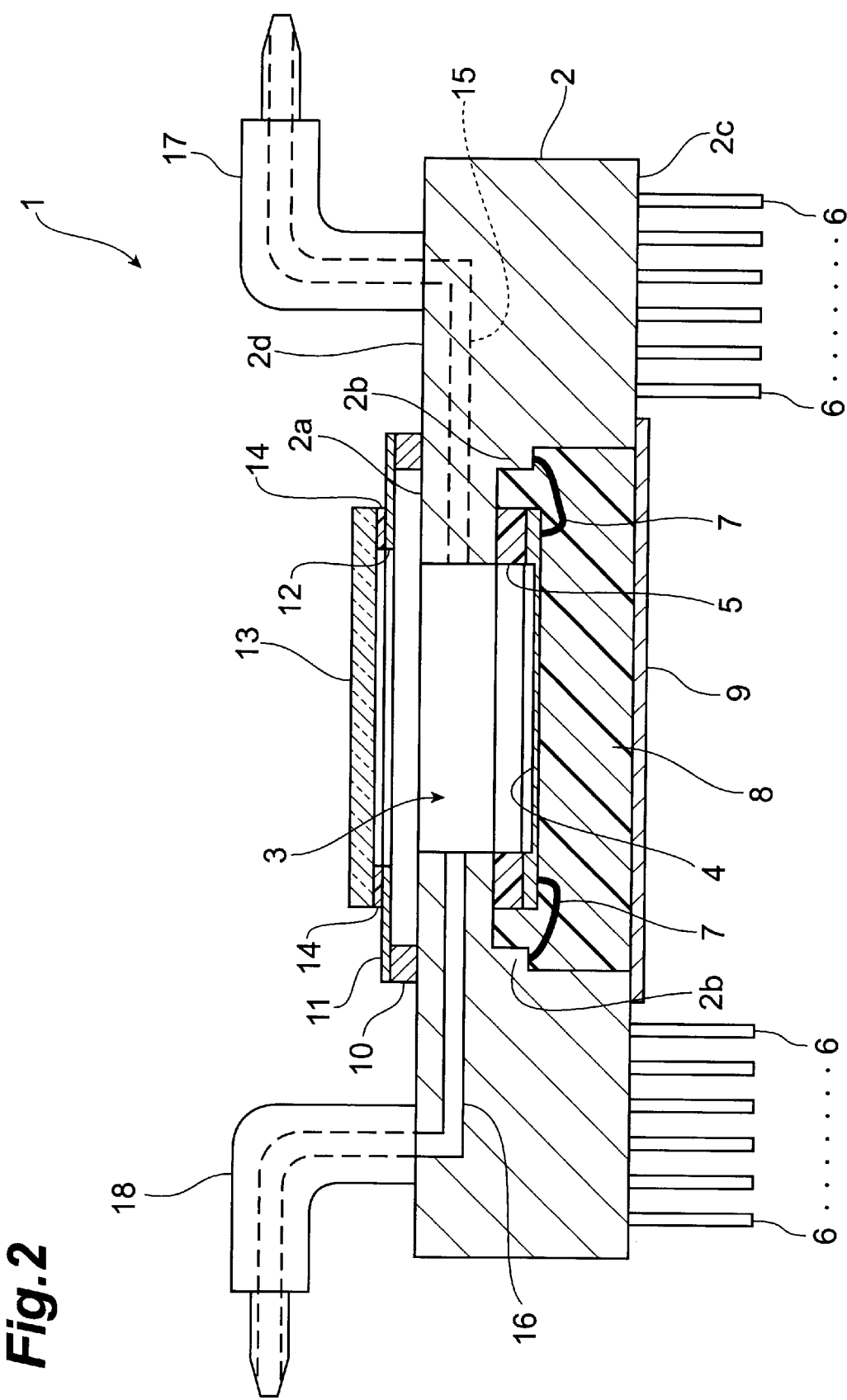
FIG. 2 is a sectional view of the semiconductor photodetecting apparatus in accordance with the first embodiment.

As shown in FIG. 1, the opening part of the gas supply path 15 on the other end side and the opening part of the gas exhaust path 16 on the other end side are disposed at respective positions diagonal to each other.

As shown in FIG. 1, a gas storage section 19 and gas supply pump 20 for supplying $N_2$ gas as a predetermined gas are connected to the pipe 17 (gas supply path 15). The gas storage section 19 is configured so as to be able to store the $N_2$ gas. By way of the pipe 17 and gas supply path 15, the gas supply pump 20 supplies the $N_2$ gas stored in the gas storage section 19 to the hollow portion 3 formed between the CCD chip 4 within the base 2 and the window portion 13. The $N_2$ gas supplied to the hollow portion 3 is discharged from the gas exhaust path 16 (pipe 18) after being refluxed through the whole hollow portion 3.

As for the operation control of the gas supply pump 20, it is not necessary for the gas supply pump 20 to be controlled such that it always actuates. For example, the operation of the gas supply pump 20 may be controlled such that it actuates during a period when measurement light is incident on the semiconductor photodetecting apparatus 1 (CCD chip 4). Also, the operation of the gas supply pump 20 maybe controlled, for example, such that it periodically actuates at predetermined intervals.

In the semiconductor photodetecting apparatus 1, as can be seen from the foregoing, the base 2 is formed with the gas supply path 15 and the gas exhaust path 16, the gas storage section 19 and gas supply pump 20 are connected to the gas supply path 15, and the gas supply pump 20 supplies the $N_2$ gas stored in the gas storage section 19 to the hollow portion 3 within the base 2 by way of the pipe 17 and gas supply path 15. The supplied $N_2$ gas is discharged from the gas exhaust path 16 (pipe 18) after being refluxed through the whole hollow portion 3. When the gas is refluxed in the hollow portion 3 as such, even in the case where the resin 8 or adhesive layer 14 is decomposed upon irradiation with ultraviolet rays and the like so as to be released to the hollow portion 3, the decomposed components released from the resin 8 or adhesive layer 14 is let out of the base 2 through the gas exhaust path 16 (pipe 18) together with the $N_2$ gas. This restrains the decomposed components released from the resin 8 or adhesive layer 14 from adsorbing to the inside surface of the window portion 13 or the photodetecting surface of the CCD chip 4 and coagulating thereon, whereby the decrease in transmissivity of measurement light (incident light) is suppressed. As a result, the CCD chip 4 can be restrained from lowering its photodetecting sensitivity.

Also, the semiconductor photodetecting apparatus 1 is provided with the gas storage section 19 and the gas supply pump 20, whereas the gas supply pump 20 supplies the $N_2$ gas to the hollow portion 3, so as to reflux the $N_2$ gas in the hollow portion 3. As a consequence, the decomposed components released from the resin 8 or adhesive layer 14 to the hollow portion 3 can be let out of the base 2 through the gas exhaust path 16.

Since the gas supply path 15 and the gas exhaust path 16 open at respective positions diagonal to each other in the semiconductor photodetecting apparatus 1, the $N_2$ gas is refluxed through the whole hollow portion 3. As a consequence, the decomposed components released from the resin 8 or adhesive layer 14 to the hollow portion 3 can efficiently be let out of the base 2 through the gas exhaust path 16.

Second Embodiment

The semiconductor photodetecting apparatus 41 in accordance with a second embodiment will now be explained with reference to FIGS. 3 and 4. The semiconductor photodetecting apparatus 1 in accordance with the first embodiment and the semiconductor photodetecting apparatus 41 in accordance with the second embodiment differ from each other in the configuration of the semiconductor photodetecting apparatus.

The semiconductor photodetecting apparatus 41 has a base 42 made of ceramics, whereas a hollow portion 43 extending in the longitudinal direction of the base 42 is formed at the center part of the base 42. Provided at the bottom part of the base 42 is a mounting portion 42a for mounting a Peltier device 44 for cooling a semiconductor photodetecting device thermoelectrically. The Peltier device 44 is firmly attached to the mounting portion 42a (base 42) in a state where an exothermic part of the Peltier device 44 is mounted on the mounting portion 42a. By way of a wiring board 47 and bumps 48, a CCD chip 46 is mounted on the upper face of an endothermic part of the Peltier device 44 positioned on the side opposite from the exothermic part, and is firmly attached to the upper face of the endothermic part. On the exothermic part, the Peltier device 44 is connected to a power supply unit (not depicted) for supplying power to the Peltier device 44.

By way of the CCD 46, which is the semiconductor photodetecting device, and the bumps 48, electrodes of the CCD chip 46 and the wiring board 47 are electrically connected (bump-bonded) to each other. The space between the CCD chip 46 and the wiring substrate 47 is filled with a resin 49 such as epoxy resin in a state where the bumps 48 are arranged. When the resin 49 cures, the thinned CCD chip 46 is reinforced and protected, whereas the CCD chip 46 and the wiring substrate 47 are secured as shown in FIG. 4.

The base 42 is provided with bonding pads (not depicted) for connecting electrodes of the CCD chip 46 to the outside. The bonding pads are conducted electrically to the leads 6 of the outside of the base 42 through a metal layer formed in an intermediate portion of the base 42. The bonding pads and the wiring board 47 are connected to each other by means of bonding wires and the like.

A window portion 50 acting as a transparent window is firmly attached to the upper face of the base 42 about the hollow portion 43 so as to surround the hollow portion 43 by way of an adhesive layer 51. The window portion 50 is made of a planar silica (quartz) glass material, while its upper and under surfaces are polished so as to transmit ultraviolet rays therethrough. Also, the end part of the light incident surface in the window portion 50 is firmly attached to the upper face of the base 42 over the whole periphery by way of the adhesive layer 51. The adhesive layer 51 uses an epoxy adhesive. It is desirable that a light-shielding metal film or the like be formed on the surface of silica glass (window portion 50) in the part provided with the adhesive layer 51, so as to prevent ultraviolet rays from irradiating the adhesive layer 51.

The base 42 is formed with a gas supply path 52 and a gas exhaust path 53. The gas supply path 52 has one end opening to a side face of the base 42, and the other end opening to a side face of the hollow portion 43. A pipe 54 is connected to the gas supply path 52 on its one end side. The pipe 54 is configured detachable. The pipe 54 is attached to the opening part of the base 42 on the one end side of the gas supply path 52 after the base 42 is hermetically sealed with the window portion 50 while providing the CCD chip 46 connecting with the wiring board 47 by way of the bumps 48.

As with the gas supply path 52, the gas exhaust path 53 is provided so as to have one end opening to a side face of the base 42, and the other end opening to a side face of the hollow portion 43. A pipe 55 is connected to the gas exhaust path 53 on its one end side. The pipe 55 is configured detachable. The pipe 55 is attached to the opening part of the base 42 on the one end side of the gas exhaust path 53 after the base 42 is hermetically sealed as with the pipe 54.

Figure 3:
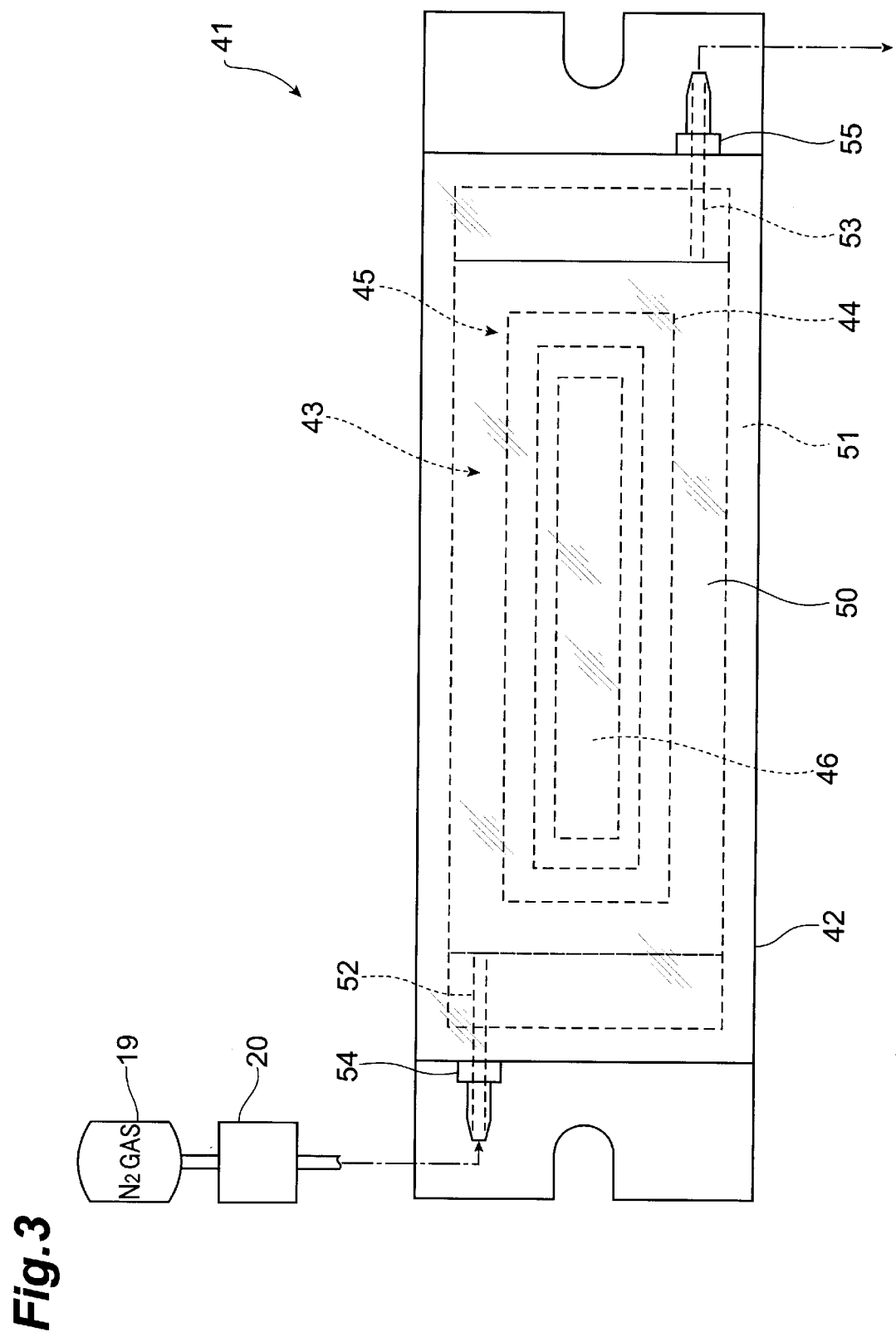
FIG. 3 is a plan view of the semiconductor photodetecting apparatus in accordance with a second embodiment.

As shown in FIG. 3, the opening part of the gas supply path 52 on the other end side and the opening part of the gas exhaust path 53 on the other end side are disposed at respective positions diagonal to each other.

In the semiconductor photodetecting apparatus 41, as can be seen from the foregoing, the base 42 is formed with the gas supply path 52 and the gas exhaust path 53, a gas storage section 19 and a gas supply pump 20 are connected to the gas supply path 52, and the gas supply pump 20 supplies the $N_2$ gas stored in the gas storage section 19 into the hollow portion 43 of the base 42 by way of the pipe 54 and gas supply path 52. The supplied $N_2$ gas is discharged from the gas exhaust path 53 (pipe 55) after being refluxed through the whole hollow portion 43. When the gas is caused to reflux in the hollow portion 43 as such, even in the case where the resin 49 or adhesive layer 51 is decomposed upon irradiation with ultraviolet rays and the like so as to be released to the hollow portion 43, the decomposed components released from the resin 49 or adhesive layer 51 is let out of the base 42 through the gas exhaust path 53 (pipe 55) together with the $N_2$ gas. This restrains the decomposed components released from the resin 49 or adhesive layer 51 from adsorbing to the inside surface of the window portion 50 or the photodetecting surface of the CCD chip 46, whereby the decrease in transmissivity of measurement light (incident light) is suppressed. As a result, the CCD chip 46 can be restrained from lowering its photodetecting sensitivity.

Also, the semiconductor photodetecting apparatus 41 is provided with the gas storage section 19 and the gas supply pump 20, whereas the gas supply pump 20 supplies the $N_2$ gas to the hollow portion 43, so as to reflux the $N_2$ gas in the hollow portion 43. As a consequence, the decomposed components released from the resin 49 or adhesive layer 51 to the hollow portion 43 can be let out of the base 42 through the gas exhaust path 53.

Since the gas supply path 52 and the gas exhaust path 53 open at respective positions diagonal to each other in the semiconductor photodetecting apparatus 41, the $N_2$ gas is refluxed through the whole hollow portion 43. As a consequence, the decomposed components released from the resin 49 or adhesive layer 51 to the hollow portion 43 can efficiently be let out of the base 42 through the gas exhaust path 53.

Third Embodiment

The semiconductor photodetecting apparatus 61 in accordance with a third embodiment will now be explained with reference to FIG. 5. The semiconductor photodetecting apparatus 61 in accordance with the third embodiment differs from the semiconductor photodetecting apparatus 1, 41 in accordance with the first and second embodiments in that a gas exhaust pump is provided therein.

The base 2 of the semiconductor photodetecting apparatus 61 is formed with a gas exhaust path 62. The gas exhaust path 62 has one end opening to the upper face (surface on the light incident surface side) 2*d* of the base 2, and the other end opening to an end face of the mounting portion 2*a*. A pipe 18 is connected to the gas exhaust path 62 on its one end side. As shown in FIG. 5, a gas exhaust pump 63 is connected to the pipe 18 (gas exhaust path 62). The gas existing in a space formed between the CCD chip 4 within the base 2 and the window portion 13 is aspirated by the gas exhaust pump 63, so as to be discharged from the gas exhaust path 62 (pipe 18).

Here, as for the operation control of the gas exhaust pump 63, it is not necessary for the gas exhaust pump 63 to be controlled such that it always actuates. For example, the operation of the gas exhaust pump 63 may be controlled such that it actuates during a period when measurement light is incident on the semiconductor photodetecting apparatus 61 (CCD chip 4). Also, the operation of the gas exhaust pump 63 may be controlled, for example, such that it periodically actuates at predetermined intervals.

In the semiconductor photodetecting apparatus 61, as can be seen from the foregoing, the base is formed with the gas exhaust path 62, whereas the gas exhaust pump 63 is connected to the gas exhaust path 62, whereby the gas existing in the hollow portion 3 is discharged from the gas exhaust path 62 (pipe 18). Even when the resin or adhesive layer 14 is decomposed so as to be released to the hollow portion 3, the decomposed components released from the resin 8 or adhesive layer 14 is let out of the base 2 through the gas exhaust path 62 (pipe 18). This restrains the decomposed components released from the resin 8 or adhesive layer 14 from adsorbing to the inside surface of the window portion 13 or the photodetecting surface of the CCD chip 4, whereby the decrease in transmissivity of measurement light (incident light) is suppressed. As a result, the CCD chip 4 can be restrained from lowering its photodetecting sensitivity.

Though the $N_2$ gas is used as the gas to be refluxed within a space formed between the semiconductor photodetecting device (CCD chip 4, 46) and the transparent window (window portion 13, 50) in the semiconductor photodetecting apparatus 1, 41 in accordance with the first and second embodiments, it is not restrictive. Employable are gases which can suppress the decrease in transmissivity when the incident light is transmitted through the space formed between the semiconductor photodetecting device and the transparent window while being able to restrain the semiconductor photodetecting device from lowering its performances, such as inert gases, e.g., Ar gas.

Though the gas supply pump 20 is provided in the semiconductor photodetecting apparatus 1, 41 in accordance with the first and second embodiments, a gas exhaust pump may be provided in place of the gas supply pump 20. When a gas exhaust pump is employed, it is connected to the gas exhaust path 16, 53 (pipe 18, 55), so as to discharge the gas from the inside of the base 2, 42, whereby the $N_2$ gas is refluxed within the base 2, 42.

Though the semiconductor photodetecting apparatus 1, 41, 61 in accordance with the first to third embodiments show an example in which the present invention is applied to a semiconductor photodetecting apparatus comprising a backside illumination type CCD chip, it is not restrictive. The present invention is also applicable to semiconductor photodetecting apparatus comprising other semiconductor photodetecting devices such as a photodiode, for example. As a matter of course, the present invention is also applicable to semiconductor photodetecting apparatus in which several resins are used in parts other than the resins 8, 49 and adhesive layers 14, 51.

From the invention thus described, it will be obvious that the invention maybe varied in many ways. Such variations are not to be regarded as a departure from the spirit and scope of the invention, and all such modifications as would be obvious to one skilled in the art are intended for inclusion within the scope of the following claims.

What is claimed is:

1. A semiconductor photodetecting apparatus comprising a container having a transparent window; and a semiconductor photodetecting device, disposed within said container, for detecting light incident thereon from said transparent window, said apparatus using a resin;

said apparatus further comprising gas flowing means for flowing a gas within said container so as to let out of said container decomposed components released from said resin in said container.

2. A semiconductor photodetecting apparatus according to claim 1, wherein said gas flowing means comprises gas exhaust means for letting out said gas from the inside of said container.

3. A semiconductor photodetecting apparatus according to claim 2, wherein said gas flowing means further comprises gas supply means for supplying a predetermined gas into said container.

4. A semiconductor photodetecting apparatus according to claim 3, wherein said gas exhaust means includes a gas exhaust path formed in said container;

wherein said gas supply means includes a gas supply path formed in said container; and wherein said gas exhaust path and gas supply path open at respective positions diagonal to each other in said container.

\* \* \* \* \*